United States Patent
Dunn

(10) Patent No.: US 10,795,413 B1
(45) Date of Patent: Oct. 6, 2020

(54) ELECTRONIC DISPLAY ASSEMBLY WITH A CHANNEL FOR AMBIENT AIR IN AN ACCESS PANEL

(71) Applicant: Manufacturing Resources International, Inc., Alpharetta, GA (US)

(72) Inventor: William Dunn, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 16/373,810

(22) Filed: Apr. 3, 2019

(51) Int. Cl.
| | |
|---|---|
| *G06F 1/16* | (2006.01) |
| *G02F 1/1347* | (2006.01) |
| *G09G 3/36* | (2006.01) |
| *H05K 5/00* | (2006.01) |
| *G02F 1/1333* | (2006.01) |

(52) U.S. Cl.
CPC .......... *G06F 1/1637* (2013.01); *G02F 1/1347* (2013.01); *G02F 1/133382* (2013.01); *G02F 1/133385* (2013.01); *G09G 3/3648* (2013.01); *H05K 5/0017* (2013.01)

(58) Field of Classification Search
CPC .................. G06F 1/1637; G02F 1/1347; G02F 1/133382; G02F 1/133385; H05K 5/0017; G09G 3/3648
See application file for complete search history.

(56) References Cited

U.S. PATENT DOCUMENTS

| | | | |
|---|---|---|---|
| 4,093,355 A | 6/1978 | Kaplit et al. | |
| 4,593,978 A | 6/1986 | Mourey et al. | |
| 4,634,225 A | 1/1987 | Haim et al. | |
| 4,748,765 A | 6/1988 | Martin | |
| 4,763,993 A | 8/1988 | Vogeley et al. | |
| 4,921,041 A | 5/1990 | Akachi | |
| 4,952,783 A | 8/1990 | Aufderheide et al. | |

(Continued)

FOREIGN PATENT DOCUMENTS

| | | |
|---|---|---|
| AU | 2011248190 B2 | 5/2011 |
| AU | 2014287438 B2 | 1/2018 |

(Continued)

OTHER PUBLICATIONS

Mentley, David E., State of Flat-Panel Display Technology and Future Trends, Proceedings of the IEEE, Apr. 2002, vol. 90, No. 4, pp. 453-459.

(Continued)

*Primary Examiner* — Nathanael R Briggs
(74) *Attorney, Agent, or Firm* — Standley Law Group LLP; Jeffrey S. Standley; Adam J. Smith

(57) ABSTRACT

An assembly for an electronic display includes a digital side assembly and an access panel mounted to a frame. The digital side assembly includes a housing, a display layer located behind a cover panel, a front channel between the display layer and the cover panel, and a side assembly open loop channel behind the display layer. A cooling channel is located between the frame and the rear surfaces of the access panel and the digital side assembly. An open loop pathway for ambient air includes the side assembly open loop channel and an access panel open loop channel. A closed loop pathway for circulating gas includes the cooling channel and the front channel.

20 Claims, 10 Drawing Sheets

(56) References Cited

U.S. PATENT DOCUMENTS

| | | |
|---|---|---|
| 4,952,925 A | 8/1990 | Haastert |
| 5,029,982 A | 7/1991 | Nash |
| 5,088,806 A | 2/1992 | McCartney et al. |
| 5,132,666 A | 7/1992 | Fahs |
| 5,247,374 A | 9/1993 | Terada |
| 5,282,114 A | 1/1994 | Stone |
| 5,293,930 A | 3/1994 | Pitasi |
| 5,351,176 A | 9/1994 | Smith Stephen W. et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,991,153 A | 11/1999 | Heady et al. |
| 6,003,015 A | 12/1999 | Kang et al. |
| 6,007,205 A | 12/1999 | Fujimori |
| 6,043,979 A | 3/2000 | Shim |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,351,381 B1 | 2/2002 | Bilski et al. |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,473,150 B1 | 10/2002 | Takushima et al. |
| 6,476,883 B1 | 11/2002 | Salimes et al. |
| 6,493,440 B2 | 12/2002 | Gromatsky et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,643,130 B1 | 11/2003 | DeMarchis et al. |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,812,851 B1 | 11/2004 | Dukach et al. |
| 6,825,828 B2 | 11/2004 | Burke et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,190,416 B2 | 3/2007 | Paukshto et al. |
| 7,190,587 B2 | 3/2007 | Kim et al. |
| 7,209,349 B2 | 4/2007 | Chien et al. |
| 7,212,403 B2 | 5/2007 | Rockenfeller |
| 7,259,964 B2 | 8/2007 | Yamamura et al. |
| 7,269,023 B2 | 9/2007 | Nagano |
| 7,284,874 B2 | 10/2007 | Jeong et al. |
| 7,396,145 B2 | 7/2008 | Wang et al. |
| 7,452,121 B2 | 11/2008 | Cho et al. |
| 7,457,113 B2 | 11/2008 | Kumhyr et al. |
| 7,480,140 B2 | 1/2009 | Hara et al. |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,800,706 B2 | 9/2010 | Kim et al. |
| 7,813,124 B2 | 10/2010 | Karppanen |
| 7,903,416 B2 | 3/2011 | Chou |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,465 B2 | 12/2011 | Nishiura |
| 8,102,173 B2 | 1/2012 | Merrow |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |

(56) References Cited

U.S. PATENT DOCUMENTS

| | | |
|---|---|---|
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,743,553 B2 | 8/2017 | Kim et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,861,007 B2 | 1/2018 | Yoon et al. |
| 9,894,800 B2 | 2/2018 | Dunn |
| 10,080,316 B2 | 9/2018 | Dunn et al. |
| 10,088,702 B2 | 10/2018 | Dunn et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,306,781 B2 | 5/2019 | Cho et al. |
| 10,359,817 B2 | 7/2019 | Yun et al. |
| 10,383,238 B2 | 8/2019 | Yun et al. |
| 10,485,147 B2 | 11/2019 | Oh et al. |
| 10,485,148 B2 | 11/2019 | Oh et al. |
| 2001/0001459 A1 | 5/2001 | Savant et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0269216 A1 | 11/2006 | Wiemeyer et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0030879 A1 | 2/2007 | Hatta |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151274 A1 | 7/2007 | Roche et al. |
| 2007/0151664 A1 | 7/2007 | Shin |
| 2007/0171353 A1 | 7/2007 | Hong |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0035315 A1 | 2/2008 | Han |
| 2008/0054144 A1 | 3/2008 | Wohlford |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0148609 A1 | 6/2008 | Ogoreve |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0135365 A1 | 5/2009 | Dunn |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissier |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |

(56) References Cited

U.S. PATENT DOCUMENTS

| | | |
|---|---|---|
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1* | 9/2010 | Nakamichi ........ H05K 7/20972 348/836 |
| 2010/0226091 A1 | 9/2010 | Dunn |
| 2010/0232107 A1 | 9/2010 | Dunn |
| 2010/0238394 A1 | 9/2010 | Dunn |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0051071 A1 | 3/2011 | Nakamichi et al. |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1 | 4/2011 | Nakamichi et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0106081 A1 | 5/2012 | Hubbard et al. |
| 2012/0188481 A1 | 7/2012 | Kang et al. |
| 2012/0206687 A1 | 8/2012 | Dunn et al. |
| 2012/0236499 A1 | 9/2012 | Murayama et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1 | 10/2013 | Dunn |
| 2013/0294039 A1 | 11/2013 | Chao |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0268657 A1 | 9/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1 | 11/2014 | Yoon et al. |
| 2015/0009625 A1 | 1/2015 | Chin et al. |
| 2015/0009627 A1 | 1/2015 | Dunn et al. |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2016/0041423 A1 | 2/2016 | Dunn |
| 2016/0044829 A1 | 2/2016 | Dunn |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0175411 A1 | 6/2017 | Bowers et al. |
| 2017/0188490 A1 | 6/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2017/0345346 A1 | 11/2017 | Hong et al. |
| 2018/0042134 A1 | 2/2018 | Dunn et al. |
| 2018/0116073 A1 | 4/2018 | Dunn |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0364519 A1 | 12/2018 | Dunn et al. |
| 2019/0037738 A1 | 1/2019 | Dunn et al. |

FOREIGN PATENT DOCUMENTS

| | | |
|---|---|---|
| AU | 2015253128 B2 | 3/2018 |
| AU | 2017216500 B2 | 10/2018 |
| AU | 2017216500 B2 | 1/2019 |
| CA | 2705814 C | 2/2018 |
| CA | 2947524 C | 4/2018 |
| CA | 2915261 C | 8/2018 |
| CA | 2809019 C | 9/2019 |
| CN | 2702363 Y | 5/2005 |
| CN | 107251671 A | 10/2017 |
| CN | 108700739 A | 10/2018 |
| EP | 1408476 A1 | 4/2004 |
| EP | 1647766 A2 | 4/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3117693 A2 | 1/2017 |
| EP | 3259968 A1 | 12/2017 |
| EP | 3423886 | 1/2019 |
| GB | 2402205 A | 12/2004 |
| JP | 402062015 A | 3/1990 |
| JP | 402307080 A | 12/1990 |
| JP | 3153212 A | 7/1991 |
| JP | H06-2337 U | 1/1994 |
| JP | 6082745 A | 3/1994 |
| JP | 8115788 A | 5/1996 |
| JP | 8194437 A | 7/1996 |
| JP | H08-305301 A | 11/1996 |
| JP | 8339034 A | 12/1996 |
| JP | H09246766 A | 9/1997 |
| JP | 11160727 A | 6/1999 |
| JP | H11296094 A | 10/1999 |
| JP | 2000-10501 A | 1/2000 |
| JP | 2001209126 A | 8/2001 |
| JP | 2002158475 A | 5/2002 |
| JP | 2004053749 A | 2/2004 |
| JP | 2004-199675 A | 7/2004 |
| JP | 2004286940 A | 10/2004 |
| JP | 2005017556 A | 1/2005 |
| JP | 2000131682 A | 5/2005 |

(56) References Cited

FOREIGN PATENT DOCUMENTS

| | | |
|---|---|---|
| JP | 2005134849 A | 5/2005 |
| JP | 2005265922 A | 9/2005 |
| JP | 2006513577 A | 4/2006 |
| JP | 2007322718 A | 5/2006 |
| JP | 2006148047 A | 6/2006 |
| JP | 2006163217 A | 6/2006 |
| JP | 2006176112 A | 7/2006 |
| JP | 2007003638 A | 1/2007 |
| JP | 2007-293105 A | 11/2007 |
| JP | 09307257 A | 11/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-503663 A | 1/2011 |
| JP | 2011-75819 A | 4/2011 |
| JP | 2012-133254 A | 7/2012 |
| JP | 2013-537721 A | 10/2013 |
| JP | 2014-225595 A | 12/2014 |
| JP | 2017518526 A | 7/2017 |
| JP | 2018-511838 A | 4/2018 |
| JP | 6305564 B2 | 4/2018 |
| KR | 20000000118 U | 1/2000 |
| KR | 20000047899 A | 7/2000 |
| KR | 1020040067701 A | 7/2004 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 100666961 B1 | 1/2007 |
| KR | 1020070070675 A | 4/2007 |
| KR | 1020070048294 | 8/2007 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 10-1885884 B1 | 7/2018 |
| KR | 10-1894027 B1 | 8/2018 |
| KR | 10-1904363 B1 | 9/2018 |
| RU | 2513043 C2 | 4/2014 |
| WO | WO2005079129 A1 | 8/2005 |
| WO | WO2007116116 A1 | 10/2007 |
| WO | WO2008050660 A2 | 5/2008 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012021573 A2 | 2/2012 |
| WO | WO2012024426 A3 | 2/2012 |
| WO | WO2013/18273 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015168375 A1 | 11/2015 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | WO2018/200260 A1 | 11/2018 |
| WO | WO2018/200905 A1 | 11/2018 |

OTHER PUBLICATIONS

Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifflin Company.
*Civiq Smartscapes LLC. v Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*Civiq Smartscapes LLC. v Manufacturing Resources International, Inc.*, Defendant's Amended Answer and Counterclaims to Plaintiff's First Amended Complaint, Filed Apr. 24, 2018, 240 pages.
Itsenclosures, Product Catalog, 2009, 48 pages.
Itsenclosures, Standard Product Data Sheet, 2011, 18 pages.
SunbriteTV, All Weather Outdoor LCD Television Model 4610HD, 2008, 1 page.
SunbriteTV, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
Adnation,Turn Key Advertising Technology Solutions, May 23, 2017, 4 pages.
Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A-Appendix D, Jan. 24, 2018, 51 pages.
Civiq, Invalidity Contentions, Jan. 24, 2018, 51 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, LLC v. Manufacturing Resources International, Inc.*, Memorandum Opinion re claim construction, Sep. 27, 2018, 16 pages.
*Civiq Smartscapes, LLC v. Manufacturing Resources International, Inc.*, Claim Construction Order, Oct. 3, 2018, 2 pages.
Anandan, Munismay, Progress of LED backlights for LCDs, Journal of the SID, 2008, pp. 287-310, Feb. 2016.

\* cited by examiner

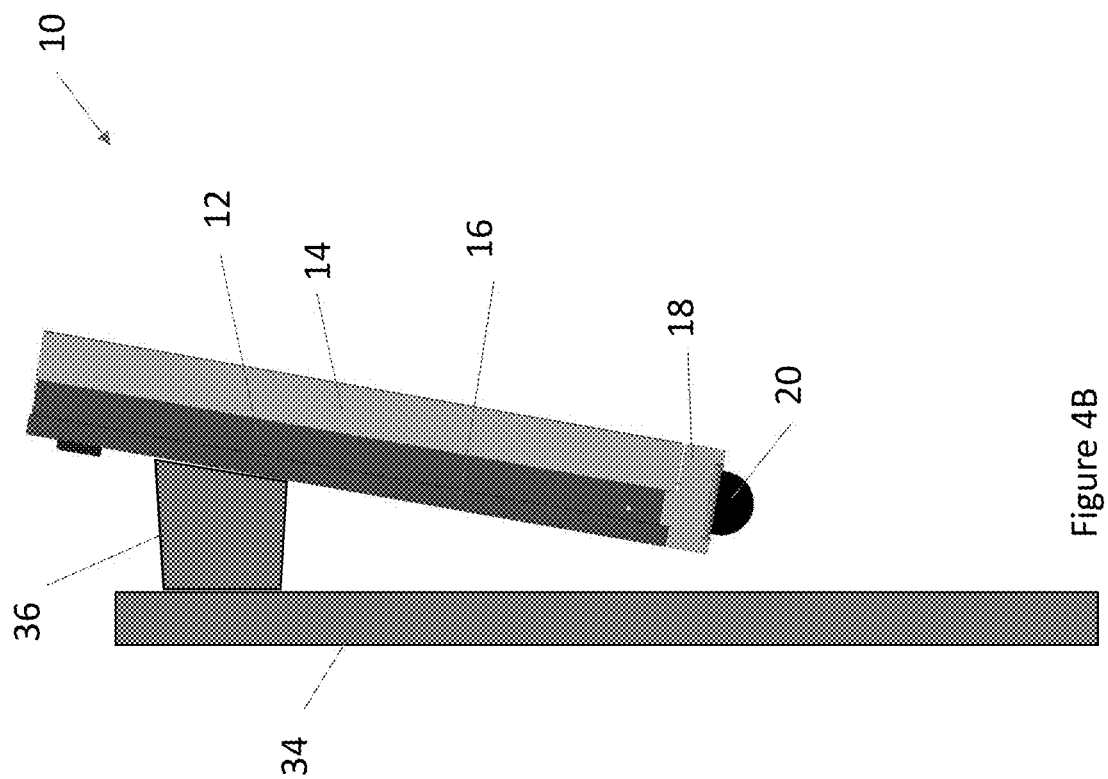
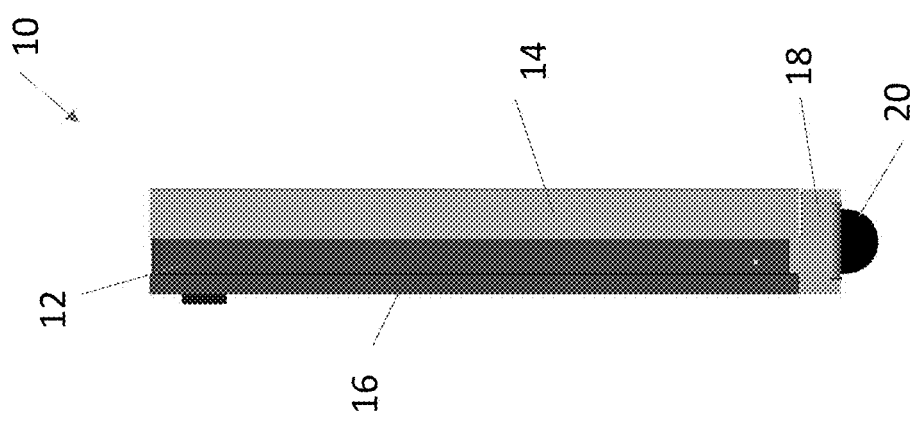
Figure 4B
Figure 4A

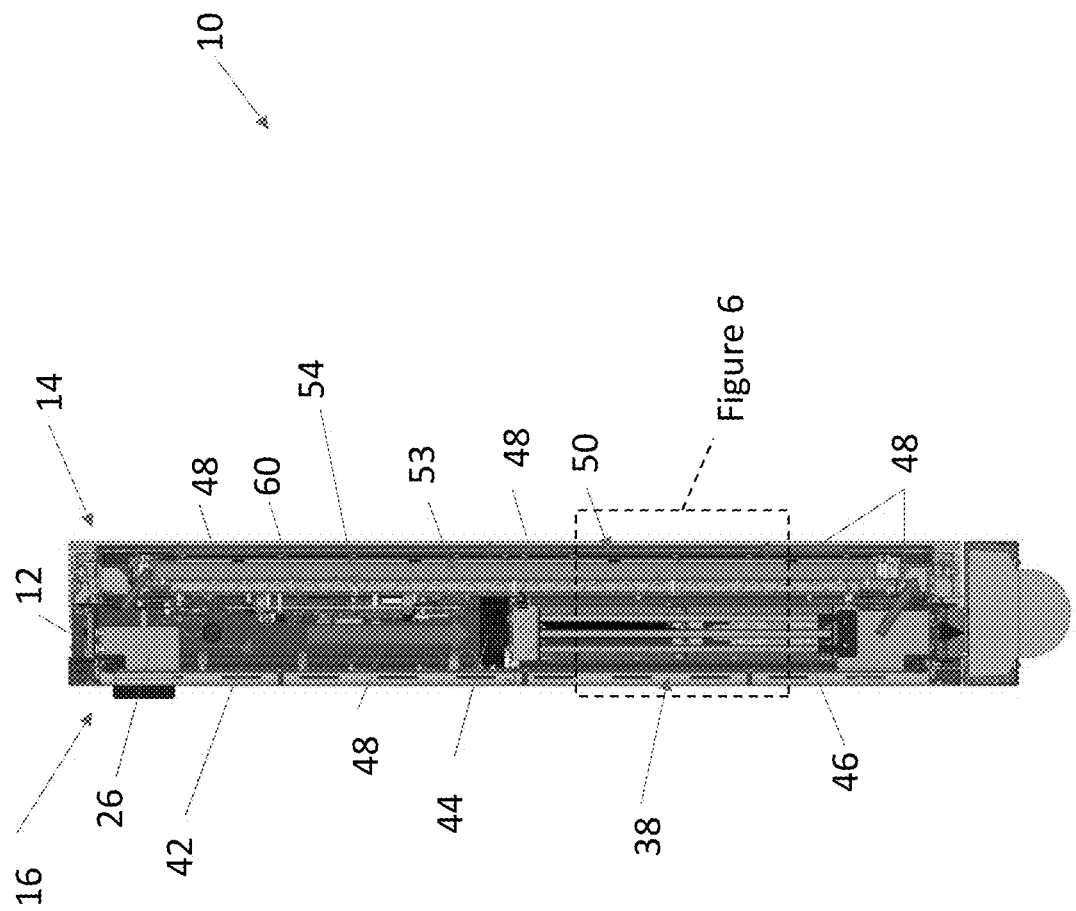

ELECTRONIC DISPLAY ASSEMBLY WITH A CHANNEL FOR AMBIENT AIR IN AN ACCESS PANEL

CROSS-REFERENCE TO RELATED APPLICATIONS

This application makes no priority claim.

TECHNICAL FIELD

Exemplary embodiments relate generally to an electronic display assembly with a channel for ambient air in an access panel.

BACKGROUND AND SUMMARY OF THE INVENTION

Electronic displays are increasingly being utilized in digital out of home ("DOOH") applications. Such DOOH applications may include placement in indoor, semi-outdoor, and outdoor locations. These electronic displays are exposed to a number of potentially harmful environmental conditions including weather, solar loading, air contaminants, vandalism, wildlife, and the like. These electronic displays are sometimes placed in ruggedized enclosures to help protect the electronic displays and related components from such harmful environmental conditions. However, the electronic displays and related components typically generate heat which needs to be removed, along with heat experienced from the environmental conditions such as ambient temperatures, solar loading, and the like. Sometimes, the assembly will be designed to accept an open loop of ambient air which thermally interacts with a closed loop of circulating gas to remove the heat.

Access to the electronic display and related components is important in order to service the assemblies, make changes, and the like. In some installation locations, a rear surface of the assembly may receive particularly high levels of solar loading. This may be especially noticeable in applications where the assembly is tilted downward.

What is needed is an electronic display assembly with a channel for ambient air in an access panel. An electronic display assembly with a channel for ambient air in an access panel is provided.

An assembly for an electronic display may comprise a frame, a digital side assembly, and an access panel. A variety of peripheral devices, such as but not limited to, cameras, sensors, microphones, and the like may be located on the frame or throughout the assembly. The access panel may comprise an access panel open loop channel which is configured to receive ambient air. The digital side assembly may include one or more electronic displays, a digital side assembly open loop channel for ambient air, and a front channel for circulating gas located between a cover panel and a display layer. The space between the frame, the digital side assembly, and the access panel may define a cooling channel for the circulating gas. One or more electronic components for operating the electronic display, the peripheral devices, or other related equipment of the assembly may be located in the cooling channel. The front channel and the cooling channel may form a closed loop for the circulating gas. A heat exchanger may be located in the cooling channel which may form part of an open loop and the cooling loop.

The open loop may include the heat exchanger, the digital side assembly open loop, and the access panel open loop. The ambient air may be ingested by way of Access Panel intakes located on the access panel. The ingested ambient air may be initially or subsequently separated into a number of flows. In exemplary embodiments, a different flow of ambient air may flow through each of the heat exchanger, the digital side assembly open loop, and the access panel open loop, and one or more fans may be dedicated to forcing air through one or more of these flow paths. One or more septa may be placed in the access panel for structural rigidity and to separate the second flow of ambient air. In other exemplary embodiments the access panel may be cooled by natural convection. The various ambient air flows may be separately exhausted from the assembly or may be merged before being exhausted.

The assembly may be configured for mounting to an external structure, such as but not limited to, a pole. The assembly may be mounted at a downward angle. The access panel may be mounted to the frame in a hinged manner. The digital side assembly may be mounted to the frame in a hinged manner.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 4A is a side view of the assembly of FIG. 1;

FIG. 4B is a side view of the assembly of FIG. 1 mounted to an external structure at a downward angle;

FIG. 5 is a side sectional view taken along section line A-A of FIG. 2;

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
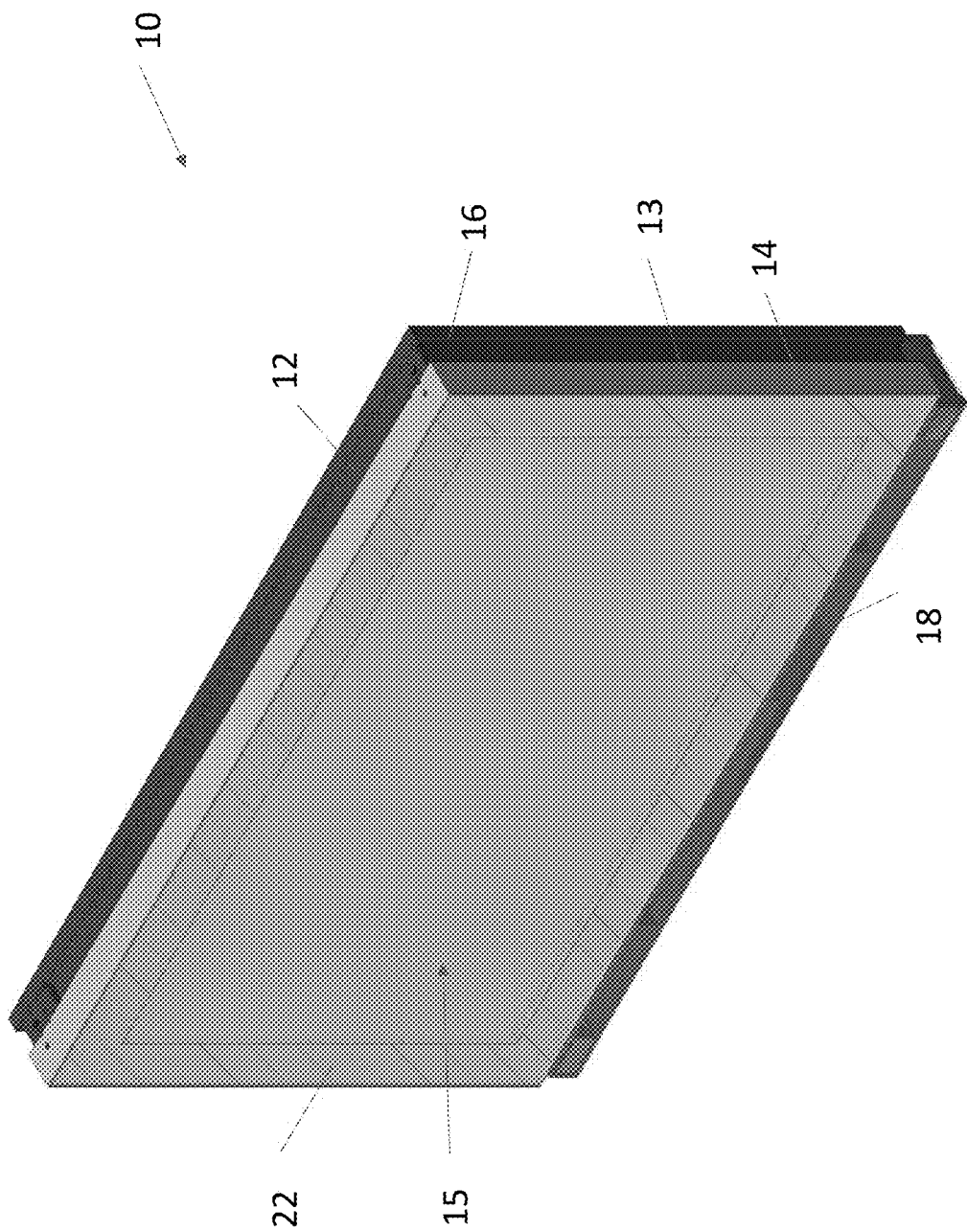
FIG. 1 is a front perspective view of an exemplary assembly.

FIG. 1 is a front perspective view of an exemplary assembly 10. The assembly may comprise a frame 12. A digital side assembly 14 may be mounted to said frame 12. The digital side assembly 14 may comprise one or more electronic displays 15. The digital side assembly 14 may be mounted to said frame 12 in a hinged manner, such as but not limited to, along the upper edge of the frame 12 and the digital side assembly 14, though such is not required. A cover panel 22 may form a front surface of the digital side assembly 14.

An access panel 16 may be mounted to an opposing side of said frame 12 as compared to the digital side assembly 14. The access panel 16 may be mounted to said frame 12 in a hinged manner, such as but not limited to, along the upper edge of the frame 12 and the access panel 16, though such is not required. In exemplary embodiments, a lower portion 18 of the frame 12 may extend below the digital side assembly 14 and the access panel 16, though such is not required.

The access panel 16 may be comprised of sheet metal, black glass, or the like. In exemplary embodiments, the access panel 16 may be substantially comprised of a substantially opaque material. The access panel 16 may be a blank sheet. The access panel 16 may be moveably mounted to said frame 12 to permit access to various components of the assembly 10, including but not limited, to the frame 12, the digital side assembly 14, and any components located within the frame 12 or the digital side assembly 14.

Figure 2:
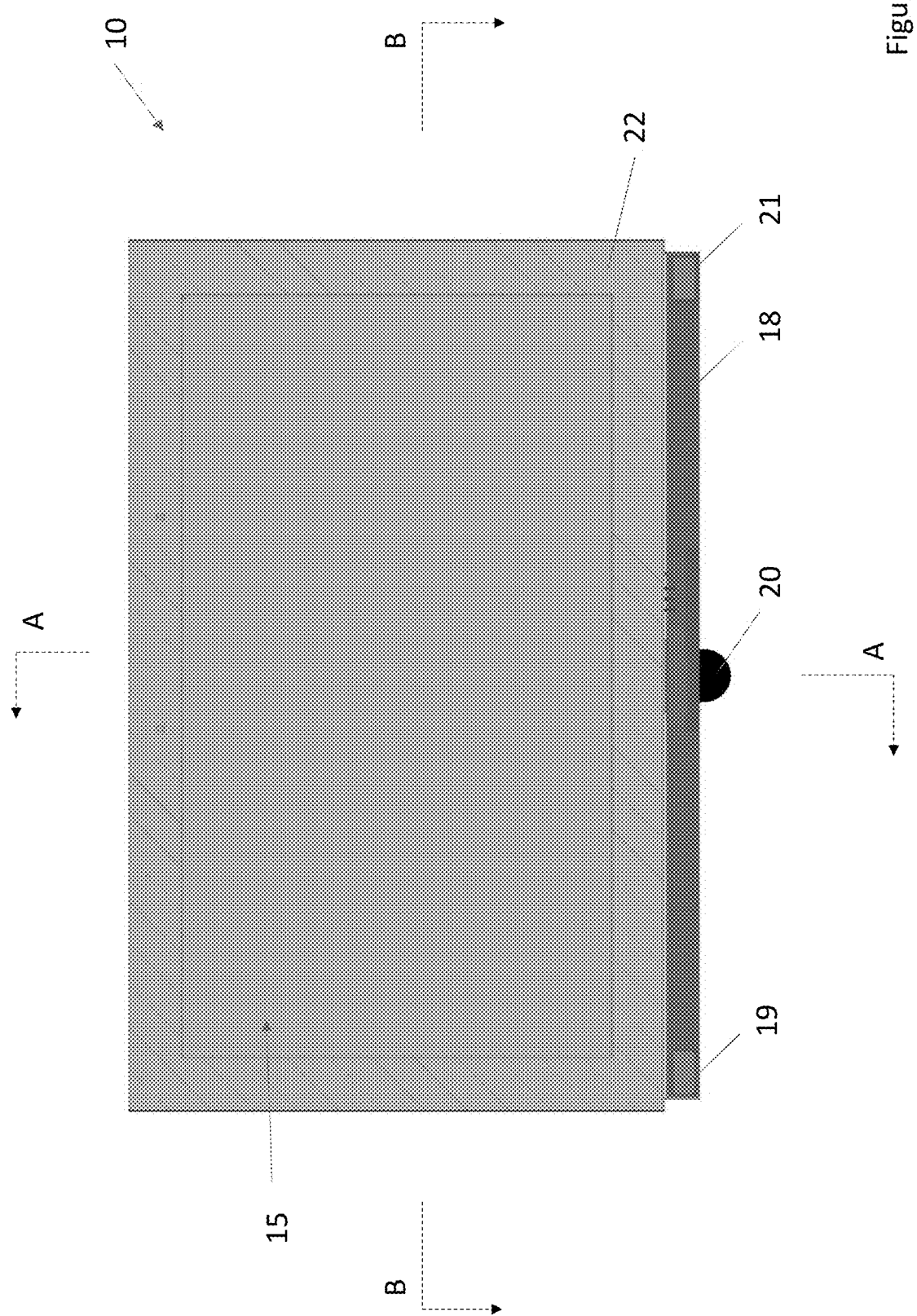
FIG. 2 is a front view of the assembly of FIG. 1 which also illustrates section line A-A and section line B-B.

FIG. 2 is a front view of the assembly 10 which also illustrates section line A-A and section line B-B. One or more peripheral devices may be located on or within the assembly 10. In exemplary embodiments, such peripheral devices may be located along the lower portion 18, though any location is contemplated. Such peripheral devices may include, but are not limited to, a camera 20, a speaker 19, a sensor 21, a microphone, or the like. Any number and type of peripheral devices are contemplated and may be located at various locations throughout the assembly 10.

Figure 3:
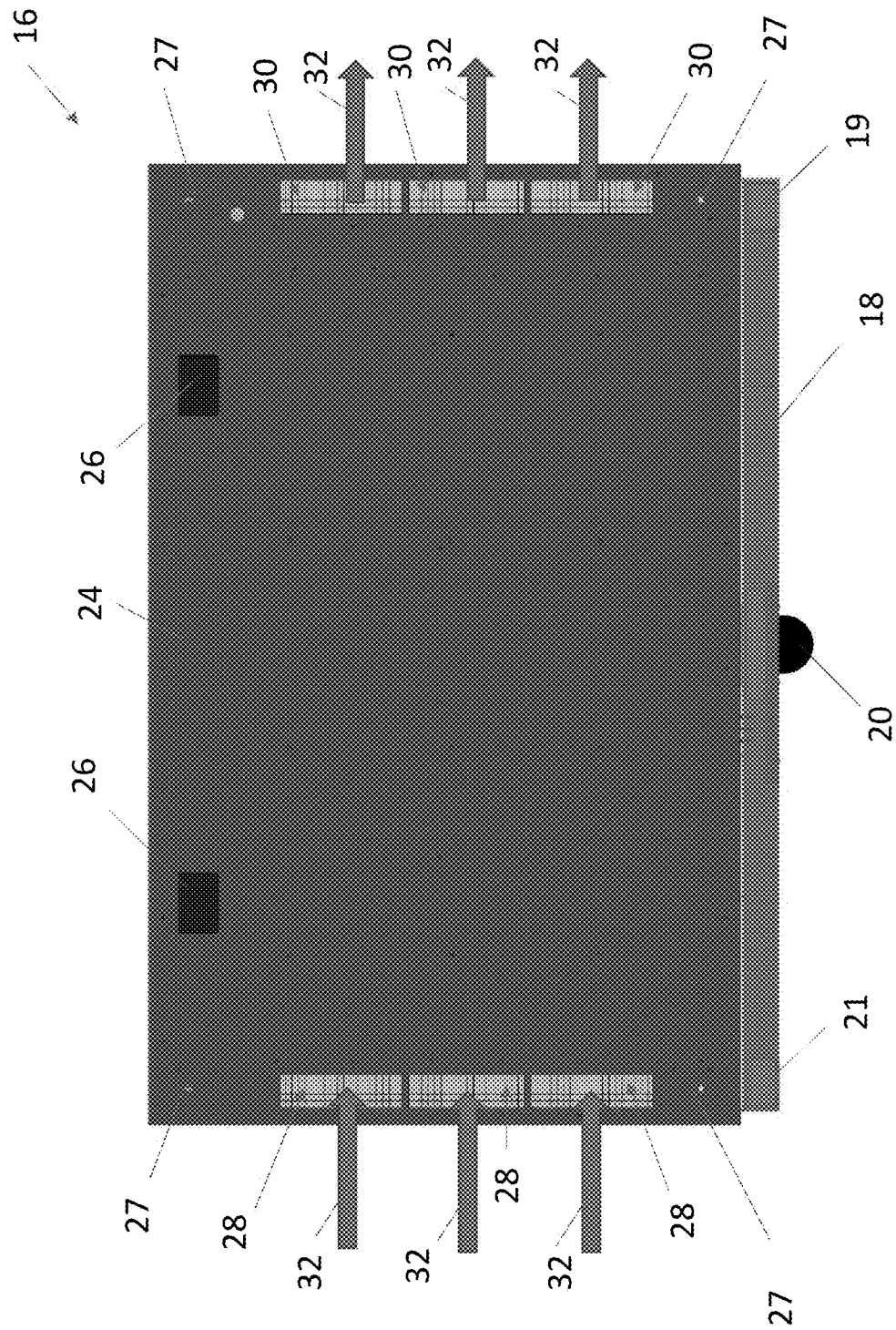
FIG. 3 is a rear view of the assembly of FIG. 1.

FIG. 3 is a rear view of the assembly 10. The access panel 16 may comprise a rear panel 24. An intake 28 may be located in the access panel 16. The intake 28 may be configured to facilitate the ingestion of ambient air 32. An exhaust 30 may be located in the access panel 16. The exhaust 30 may be configured to facilitate the exhaust of the ambient air 32. In exemplary embodiments, a number of intakes 28 may be located along one side of the rear panel 24, while a number of exhausts 30 may be located along an opposing side of the rear panel 24, though any number and location of intakes 28 and exhausts 30 is contemplated. In such exemplary embodiments, without limitation, each of the intakes 28 may be configured to ingest one or more flows of the ambient air 32 and each of the exhausts 30 may be configured to exhaust one or more flows of the ambient air 32. One or more antennas 26 may extend through apertures in the rear panel 24. A number of mounting apertures 27 may be located in the rear panel 24. In exemplary embodiments, the mounting apertures 27 may be configured to receive fasteners, brackets, clamps, pins, or the like which may connect to one or more internal components of the assembly 10.

FIG. 4A is a side view of the assembly 10 and FIG. 4B is a side view of the assembly 10 mounted to an exemplary external structure 34 at a downward angle such as, but not limited to, 10 degrees. The mounting apertures 27 may be configured to receive fasteners, brackets, clamps, pins, or the like for mounting the assembly 10 to an external structure 34. In exemplary embodiments, the mounting apertures 27 may be circular and located near each corner of the rear panel, though any number, size, shape, and location of mounting apertures 27 are contemplated. The external structure 34 may be a pole, an elongate member, a wall, a surface, or the like. A mounting device 36 may be used to secure the assembly 10 to the external structure 34, though such is not required. In other exemplary embodiments, the assembly 10 may be mounted to the external structure 34 or the mounting device 36 directly. The antennae 26 may extend through the rear panel 24 to improve signal reception.

Figure 6:
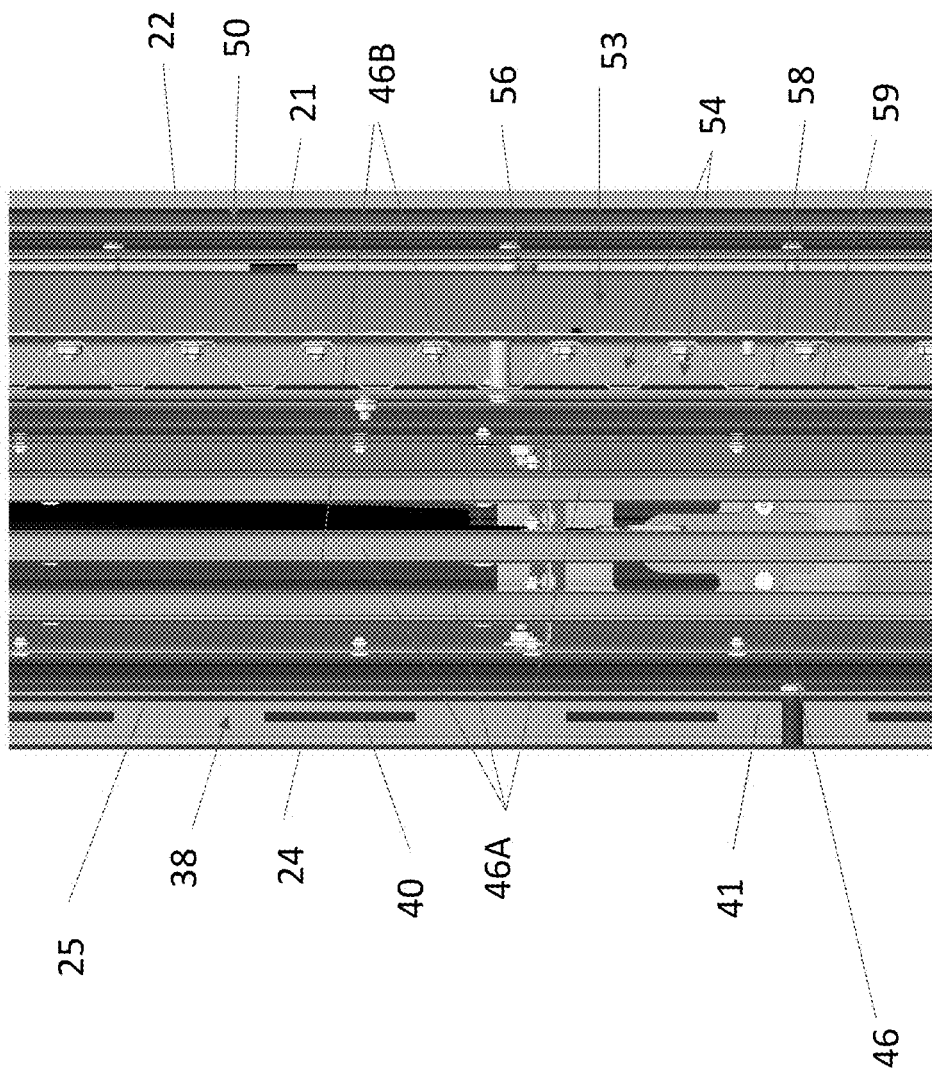
FIG. 6 is a detailed side sectional view of FIG. 5.

FIG. 5 is a side sectional view taken along section line A-A of FIG. 2 and FIG. 6 is a detailed side sectional view of FIG. 5. The mounting apertures 27 may permit the fasteners, brackets, clamps, pins, or the like to connect to the frame 12. The access panel 16 may comprise the rear panel 24 and an access panel interior panel 25, which may be located behind, spaced apart from, and substantially parallel to the rear panel 24. An access panel open loop channel 38 may be located between the rear panel 24 and the access panel interior panel 25. A number of stiffeners 41 may be located in the access panel open loop channel 38. Each of the stiffeners 41 may comprise one or more apertures 40 which permit the flow of the ambient air 32 therethrough. The stiffeners 41 may be spaced apart at regular or varying intervals. The apertures 40 may be spaced apart at regular or varying intervals to permit ambient air 32 to travel therethrough. The stiffeners 41 may be elongate members, though any size, shape, and number of stiffeners 41 are contemplated. A first flow 32A of the ambient air 32 may travel through the access panel open loop channel 38.

A cooling channel 42 may be located between the access panel 16 and the digital side assembly 14 and may be located within the frame 12. Various electronic components 60 for operating the electronic display 15 as well as peripheral devices and other components of the assembly 10, such as but not limited to, the camera 20, the speaker 19, the sensor 21, and the like may be located within the cooling channel 42. Such electronic components 60 may be mounted to the rear surface of the digital side assembly 14, the rear surface of the access panel 16, or the interior surfaces of the frame 12. The cooling channel 42 may be configured to receive circulating gas 48.

A heat exchanger 46 may be located within the cooling channel 42. The heat exchanger 46 may be configured to receive the ambient air 32 as well as the circulating gas 48. In exemplary embodiments, the heat exchanger 46 may comprise a number of closed loop layers 46B for the circulating gas 48 and a number of open loop layers 46A for the ambient air 32. The closed loop layers 46B may be alternated with the open loop layers 46A, though such is not required. The heat exchanger 46 may be a cross-flow, counter-flow, parallel flow, or other type of heat exchanger. The open loop layers 46A may be configured to receive a third flow 32C of the ambient air 32.

An electronic display layer 21 may be located behind the cover panel 22. In exemplary embodiments, the display layer 21 is located behind, spaced apart from, and extends substantially parallel with the cover panel 22. The electronic display layer 21 may be, without limitation, comprised of liquid crystals. It is contemplated, however, that any type of electronic display 15 may be utilized within the digital side assembly 14 such as, but not limited to, an LCD, OLED, cathode ray tube, LED, or the like. Any number of films or additional layers are contemplated such as, but not limited to, enhancement films, diffusers, optical adhesives, polarizers, some combination thereof, or the like.

A front channel 50 may be located between the cover panel 22 and the electronic display layer 21. The front channel 50 may be configured to receive the circulating gas 48. The front channel 50 and the cooling channel 42 may form a closed loop. One or more closed loop fans 44 may be placed along the closed loop to force the circulating gas 48 through the closed loop. In exemplary embodiments the closed loop fans 44 may be located along an upper edge of the heat exchanger 46, though any location, or multiple locations, are contemplated. Additionally, while the circulating gas 48 is illustrating as flowing counterclockwise, it is contemplated that the circulating gas 48 may flow clockwise. Furthermore, while the circulating gas 48 is illustrated as flowing vertically through the cooling channel 42 and the front channel 50, it is contemplated that the circulating gas 48 may flow horizontally.

A rear digital side assembly layer 56 may be located behind the electronic display layer 21. In exemplary embodiments, the rear digital side assembly layer 56 is located behind, spaced apart from, and extends substantially parallel with the display layer 21. The rear digital side assembly layer 56 may comprise a number of illumination devices, such as but not limited to LEDs, mounted to a printed circuit board to form a backlight for the electronic display layer 21, though such is not required. The electronic display 15 may be directly backlit, edge lit, self-phosphorescing (e.g., OLED), or the like.

An interior digital side assembly panel 59 may be located behind the rear digital side assembly layer 56. In exemplary embodiments, the interior digital side assembly panel 59 is located behind, spaced apart from, and extends substantially parallel with the rear digital side assembly layer 56. A side assembly open loop channel 54 may be located between the rear digital side assembly layer 56 and the interior digital side assembly panel 59. The side assembly open loop channel 54 may be configured to receive a second flow 32B of the ambient air 32. A corrugated layer 58 may be provided in the side assembly open loop channel 54, though such is not required. The corrugated layer 58 may be provided in a honeycomb pattern, zig-zag pattern, as fins, as ribs, some combination thereof, or the like. In exemplary embodiments, the side assembly open loop channel 54 may be placed directly adjacent to the backlight 56. In this way, the second flow 32B of the ambient air 32 may remove heat generated by the backlight 56. The use of the corrugated layer 58 may improve the distribution of the second flow 32B of the ambient air 32 such that cooling is improved.

In exemplary embodiments, the cooling channel 42 may be located between the interior digital side assembly panel 59 and the access panel interior panel 25. A backlight cavity 53 may be located between the rear digital side assembly layer 56 and the electronic display layer 21. In exemplary embodiments, the backlight cavity 53 is partially or completely sealed. In other exemplary embodiments, a small flow of the circulating gas 48 may be directed to flow through the backlight cavity 53.

Figure 7:
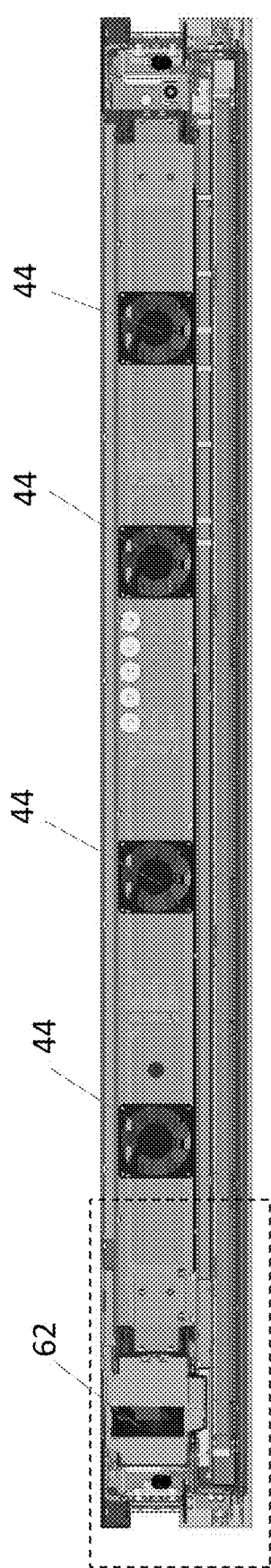
FIG. 7 is a top sectional view taken along section line B-B of FIG. 2.
Figure 8:
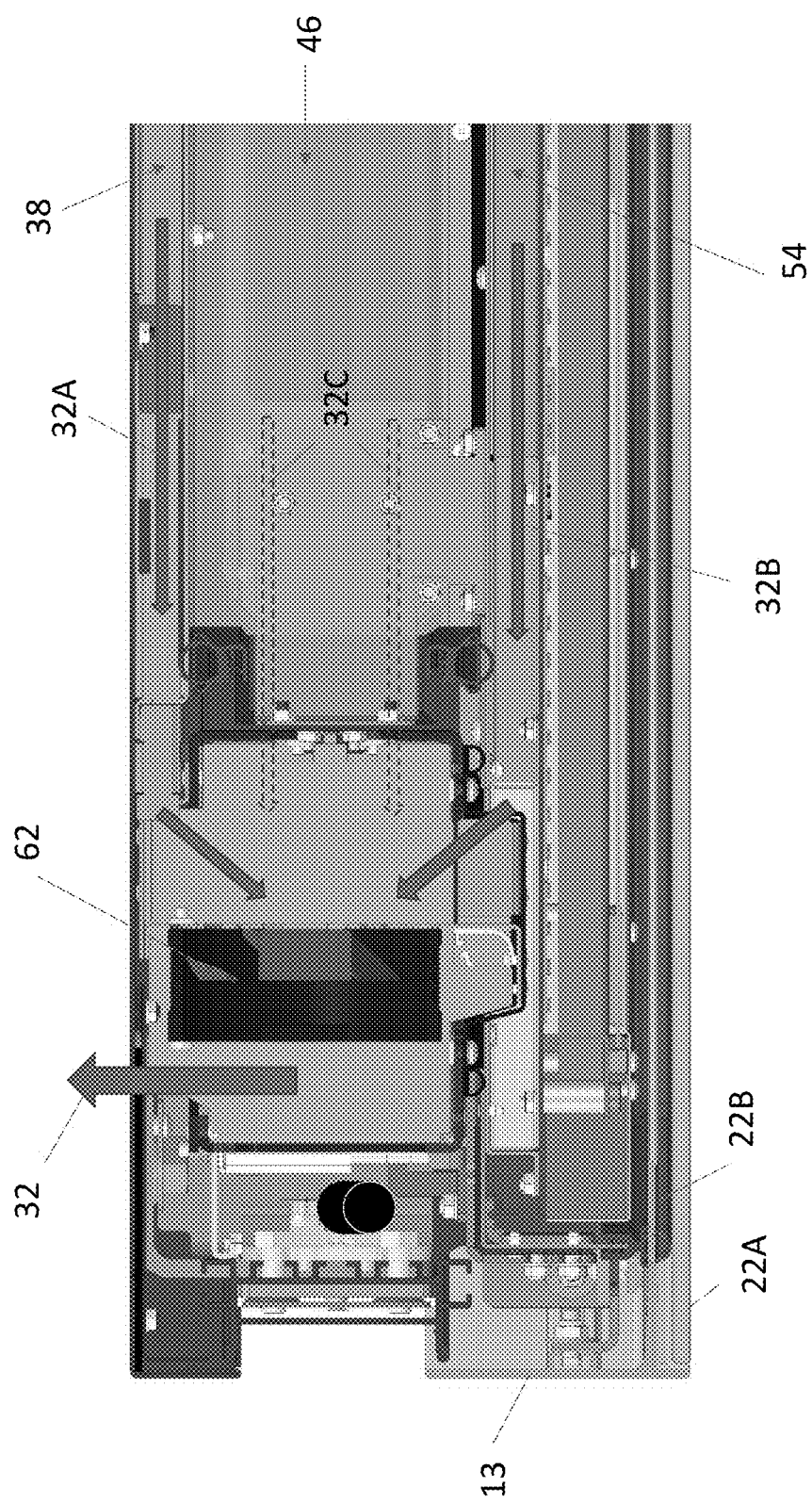
FIG. 8 is a detailed top sectional view of FIG. 7.

FIG. 7 is a top sectional view taken along section line B-B of FIG. 2 and FIG. 8 is a detailed top sectional view of FIG. 7. The closed loop fans 44 may be spaced apart at regular or irregular intervals along the heat exchanger 46. The first flow 32A of the ambient air 32 through the access panel open loop channel 38, the second flow 32B of the ambient air 32 through the side assembly open loop channel 54, as well as the third flow 32C of the ambient air 32 through the heat exchanger 46 may form an open loop. The various flows 32A-32C of the ambient air 32 though the various pathways may be caused by one or more open loop fans 62. The various flows 32A-32C of the ambient air 32 may be exhausted separately or may rejoined before being exhausted from the assembly 10. While the ambient air 32 is illustrated as flowing horizontally through the open loop, it is contemplated that the ambient air 32 may flow vertically through the open loop layer. While the ambient air 32 is illustrated as flowing from right to left in through the open loop layer, it is contemplated that the ambient air 32 may flow from left to right through the open loop layer.

The cover panel 22 may be comprised of multiple layers. For example, without limitation, the cover panel 22 may be comprised of a first 22A and a second 22B layer. The first and second layers 22A and 22B may be secured to one another by way of an optically clear adhesive. The cover panel 22 may be comprised or glass, a polymer, or the like. Any transparent or translucent material is contemplated.

The digital side assembly 14 may comprise a housing 13 for various components of the digital side assembly 14 such as, but not limited to, the cover panel 22, the electronic display layer 21, the rear digital side assembly layer 56, the side assembly open loop channel 54, and the interior digital side assembly panel 59, some combination thereof, or the like.

Figure 9:
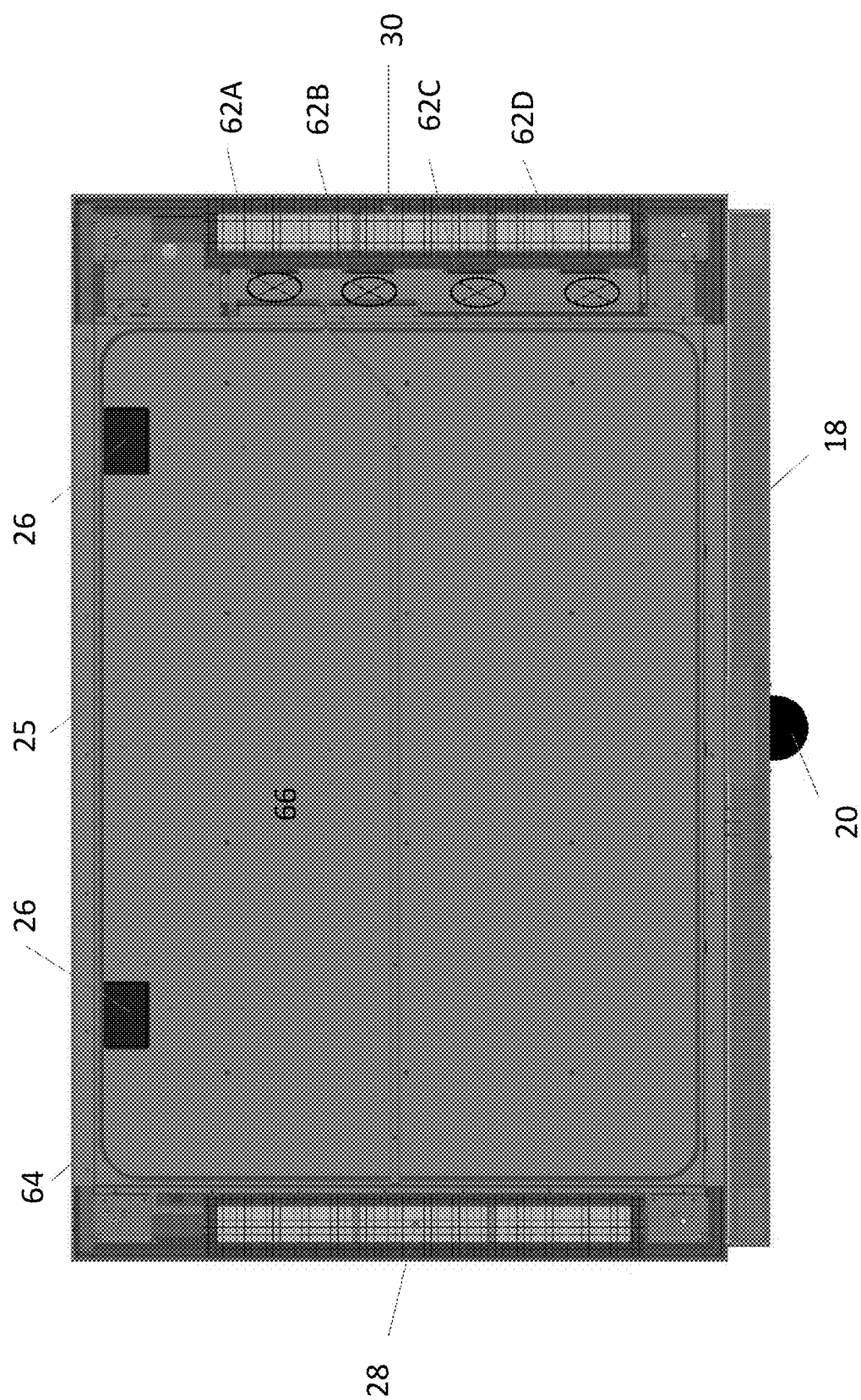
FIG. 9 is a rear view of the assembly of FIG. 3 with the rear cover removed to illustrate additional components of the assembly.

FIG. 9 is a rear view of the assembly 10 with the rear cover 24 removed such that the access panel interior panel 25 is shown. In exemplary embodiments, without limitation, each of the various flows 32A-32C may be ingested by various open loop fans 62A, 62B, 62C, and 62D. For example, without limitation, each of the open loop fans 62A, 62B, 62C, and 62D may be dedicated to ingesting ambient air 32 dedicated to a given open loop flow 32A-32C. As another example, without limitation, the first and second open loop fan 62A and 62B may ingest ambient air 32 directed to the first flow 32A for the access panel open loop channel 38 and the second flow 32B for the side assembly open loop channel 54. The third open loop fan 62C may ingest ambient air 32 directed to the third flow 32C for the heat exchanger 46. The fourth open loop fan 62D may ingest ambient air 32 directed to the fourth flow 32D for the heat exchanger 46 and the second flow 32B for the side assembly open loop channel 54. Any combination is contemplated. Various septa, dividers, channels, pathways, plenums, some combination thereof, or the like may be provided, positioned, and configured to direct the various flows into their respective pathways.

A gasket 64 may be located around a portion of the access panel interior panel 25 such that the access panel open loop channel 38 is sealed by compression of the rear panel 24 against the access panel interior panel 25.

One or more access panel septa 66 may be located within the access panel open loop channel 38. The access panel septa 66 may separate the first flow 32A traveling through the access panel open loop channel 38.

In other exemplary embodiments the access panel 16 may be cooled by convection. In such embodiments, the access panel open loop channel 38 may be provided but no open loop fans 62 may be required. Instead, the access panel open loop channel 38 may remain open to the ambient air 32, which may travel through the open loop by natural convection, wind, and the like. Alternatively, or in addition, the access panel open loop channel 38 may serve as a thermal buffer to the remainder of the assembly 10.

Figure 10:
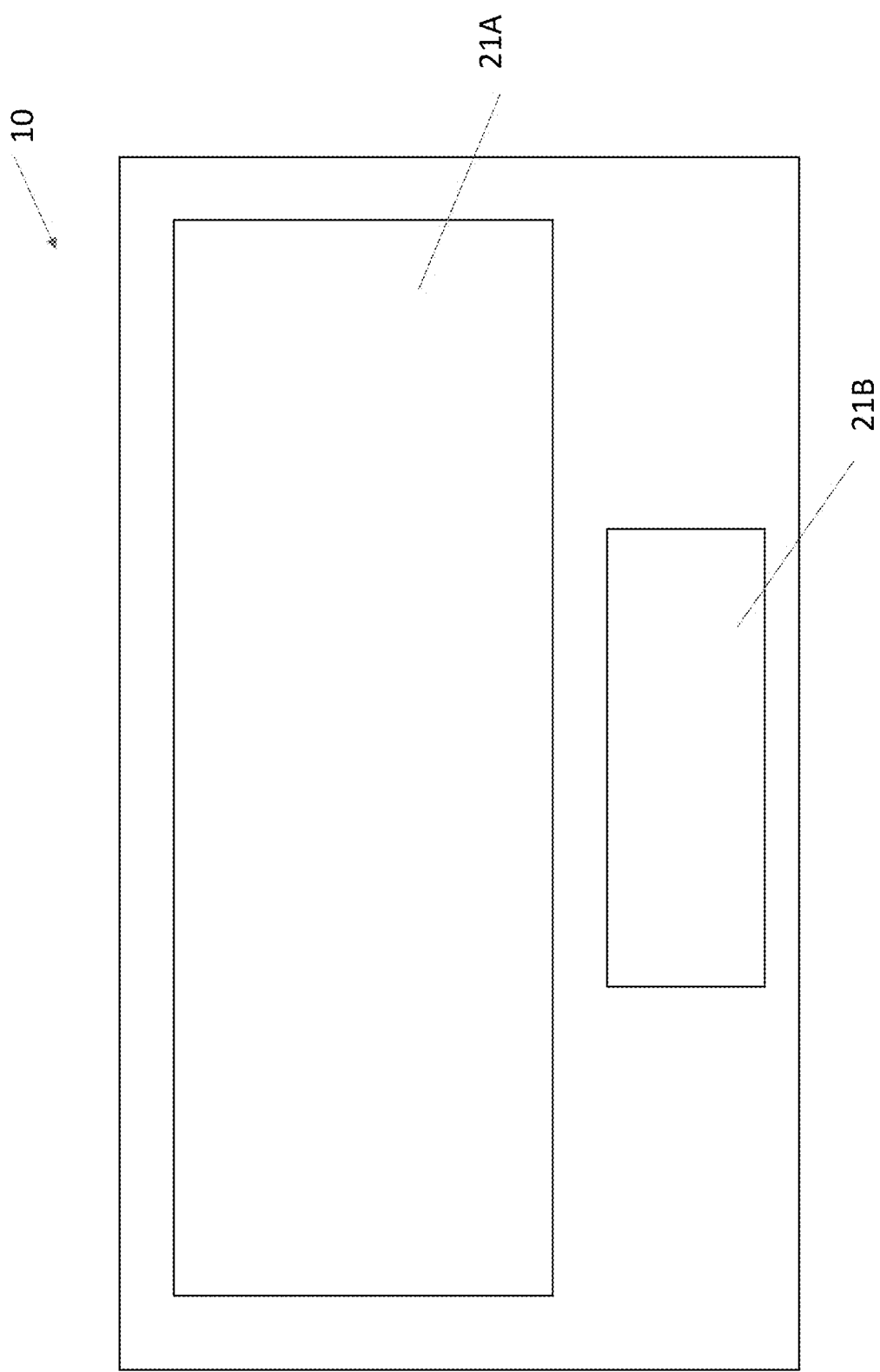
FIG. 10 is a front view of another exemplary embodiment of the assembly, with certain components removed to illustrate multiple electronic displays.

As illustrated in FIG. 10, in exemplary embodiments, without limitation, one or more electronic displays may be utilized. In such embodiments, multiple electronic display layers 21 may be provided to form multiple electronic display areas within the assembly 10. Such electronic display layers 21 may be separated from one another. For example, without limitation, a first electronic display layer 21A may be placed above a second electronic display layer 21B. As a further example, again without limitation, the first electronic display layer 21A may be placed on either side of the second electronic display layer 21B. As a further example, without limitation, the first and second electronic display layers 21A and 21B may be placed adjacent to one another to form the appearance of a larger display. Any number, positioning, orientation, size, shape, and the like of the electronic display layers 21 is contemplated. A common cover panel 22 may extend over all of the electronic display layers 21. In other exemplary embodiments, a separate cover panel 22 may extend over each electronic display layer 21.

It is notable that while the assembly 10 is illustrated in a landscape arrangement, it is contemplated that the assembly 10 may be provided in a portrait arrangement. Any size and shape assembly 10 is contemplated. In such embodiments, the lower portion 18 may be positioned such that it extends below the lower edge of the electronic display 15.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

What is claimed is:

1. An assembly for an electronic display comprising:
a frame;
a digital side assembly mounted to said frame and comprising:
  a housing;
  a cover panel;
  one or more display layers located behind said cover panel;
  a front channel located between said display layer and said cover panel; and
  a side assembly open loop channel located behind the display layer;
an access panel mounted to said frame and comprising an access panel open loop channel;
a cooling channel located within said frame and between a rear surface of said access panel and a rear surface of said digital side assembly;
an open loop pathway for ambient air comprising said side assembly open loop channel and said access panel open loop channel; and
a closed loop pathway for circulating gas comprising said cooling channel and said front channel.

2. The assembly of claim 1 wherein:
said access panel and said digital side assembly are mounted to opposing sides of said frame in a hinged fashion.

3. The assembly of claim 2 further comprising:
one or more closed loop fans positioned along the closed loop pathway to force the circulating gas through the closed loop.

4. The assembly of claim 3 further comprising:
one or more open loop fans positioned along the open loop pathway to force the ambient air through the open loop.

5. The assembly of claim 4 further comprising:
a heat exchanger located in said cooling channel and comprising one or more closed loop layers for circulating gas and one or more open loop layers for ambient air, wherein said open loop pathway further comprises said one or more open loop layers and said closed loop pathways comprise said one or more closed loop layers.

6. The assembly of claim 5 further comprising:
one or more electronic components for operating the digital side assembly mounted within said cooling channel.

7. The assembly of 6 further comprising:
an intake opening for ingesting the ambient air located in said access panel; and
an exhaust opening for exhausting the ambient air located in said access panel.

8. The assembly of claim 7 wherein:
said intake opening is in fluid communication with said side assembly open loop channel, said access panel open loop channel, and said open loop layers of the heat exchanger.

9. The assembly of claim 8 wherein:
said exhaust opening is in fluid communication with cooling channel, said front channel, and said closed loop layers of the heat exchanger.

10. The assembly of claim 9 wherein:
said one or more open loop fans comprise a first, second, third, and fourth open loop fan;
said first and second fans are configured to force ambient air through only said side assembly open loop channel and said access pane open loop channel;
said third fan is configured to force ambient air through only the one or more open loop layers of the heat exchanger; and
said fourth fan is configured to force ambient air through only the one or more open loop layers of the heat exchanger and the side assembly open loop channel.

11. The assembly of claim 1 further comprising:
at least one bracket for mounting the assembly to a mounting structure such that said assembly is tilted at a downward angle.

12. The assembly of claim 11 wherein:
said mounting structure is a pole; and
said downward angle is between five and fifteen degrees.

13. The assembly of claim 1 further comprising:
a corrugated layer located in said side assembly open loop channel;
at least one septum located in said access panel open loop channel;

a lower portion of said frame which extends below said digital side assembly; and
one or more peripheral devices located at said lower portion, wherein said one or more peripheral devices are selected from the group consisting of: a speaker, a microphone, a camera, and a sensor.

14. The assembly of claim 1 wherein:
a rear surface of said access panel is comprised of a substantially opaque material.

15. The assembly of claim 1 wherein:
the display layer is comprised of liquid crystals; and
the display layer is directly backlit.

16. An assembly for an electronic display comprising:
a frame having a first side and a second side which oppose one another;
a digital side assembly mounted to the first side of said frame in a hinged fashion and comprising:
  a housing;
  a cover panel;
  a display layer located behind said cover panel;
  a front channel located between said display layer and said cover panel;
  a side assembly open loop channel located behind the display layer; and
  a corrugated layer located within the side assembly open loop channel;
an access panel mounted to the second side of said frame in a hinged fashion and comprising an access panel open loop channel;
a cooling channel located between said frame, a rear surface of said access panel, and a rear surface of said digital side assembly;
a heat exchanger located in said cooling channel and comprising one or more closed loop layers for circulating gas and one or more open loop layers for ambient air;
an open loop pathway for ambient air comprising said side assembly open loop channel, said access panel open loop channel, and said one or more open loop layers of the heat exchanger; and
a closed loop pathway for circulating gas comprising said cooling channel, said front channel, and said one or more closed loop layers of the heat exchanger.

17. The assembly of claim 16 further comprising:
a first and a second open loop fan positioned to force air through only said side assembly open loop channel and said access pane open loop channel;
a third open loop fan positioned to force air through only the one or more open loop layers of the heat exchanger; and
a fourth open loop fan configured to force air through only the one or more open loop layers of the heat exchanger and the side assembly open loop channel.

18. The assembly of claim 16 further comprising:
a number of stiffeners located within said access panel open loop channel; and
a number of apertures in said stiffeners configured to permit the ambient air to pass therethrough.

19. The assembly of claim 16 further comprising:
at least one bracket for mounting the assembly to a pole such that said assembly is tilted at a downward angle.

20. An assembly for an electronic display comprising:
a frame having an upper side, a lower side, a right side, and a left side which form a substantially rectangular structure;
a digital side assembly mounted to the upper side of said frame in a hinged fashion and comprising:
  a housing;
  a cover panel;
  one or more liquid crystal layers located behind, spaced apart from, and substantially parallel to said cover panel;
  a backlight layer located behind, spaced apart from, and substantially parallel to said liquid crystal layer;
  a front channel located between said liquid crystal layer and said cover panel;
  a digital side assembly interior panel located behind, spaced apart from, and substantially parallel to said backlight layer; and
  a side assembly open loop channel located between said backlight layer and said digital side assembly interior panel;
an access panel mounted to the upper side of said frame in a hinged fashion such that said access panel is paced in a back to back arrangement with said digital side assembly, said access panel comprising:
  a rear panel comprised of an opaque material;
  an access panel interior panel located behind, spaced apart from, and substantially parallel to said rear panel;
  an access panel open loop channel located between said rear panel and said access panel interior panel;
  an intake opening located along a first side said rear panel; and
  an exhaust opening located along a second side said rear panel;
a cooling channel located between said upper side, said left side, said right side, said lower side, said access panel interior panel, and said digital side assembly interior panel;
a heat exchanger located in said cooling channel and comprising one or more closed loop layers for circulating gas and one or more open loop layers for ambient air;
an open loop pathway for ambient air comprising said side assembly open loop channel, said access panel open loop channel, and said one or more open loop layers of the heat exchanger;
a closed loop pathway for circulating gas comprising said cooling channel, said front channel, and said one or more closed loop layers of the heat exchanger;
a number of closed loop fans positioned adjacent to said heat exchanger to force the circulating gas through the closed loop; and
a number of open loop fans positioned adjacent to the exhaust opening to force the ambient air through the open loop.

* * * * *

UNITED STATES PATENT AND TRADEMARK OFFICE
CERTIFICATE OF CORRECTION

PATENT NO. : 10,795,413 B1
APPLICATION NO. : 16/373810
DATED : October 6, 2020
INVENTOR(S) : William Dunn Page 1 of 1

It is certified that error appears in the above-identified patent and that said Letters Patent is hereby corrected as shown below:

In the Specification

Column 1, Line 67, please delete "Access Panel".

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*